United States Patent
Schat

(10) Patent No.: US 10,565,156 B1
(45) Date of Patent: Feb. 18, 2020

(54) WIRED-DATA BUS TRANSMISSION USING SIGNAL TRANSITION CODING

(71) Applicant: NXP B.V., Eindhoven (NL)

(72) Inventor: Jan-Peter Schat, Hamburg (DE)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/191,936

(22) Filed: Nov. 15, 2018

(51) Int. Cl.
| G06F 13/42 | (2006.01) |
| G06F 13/40 | (2006.01) |
| G06F 11/14 | (2006.01) |
| H04L 25/493 | (2006.01) |
| H03M 5/04 | (2006.01) |

(52) U.S. Cl.
CPC ........ G06F 13/4291 (2013.01); G06F 11/141 (2013.01); G06F 13/4068 (2013.01); H04L 25/493 (2013.01); H03M 5/04 (2013.01)

(58) Field of Classification Search
CPC ........ G06F 13/374; G06F 13/38; G06F 13/40; G06F 13/4063; G06F 13/4068; G06F 13/4072; G06F 13/42; G06F 13/4204; G06F 13/4208; G06F 13/4217; G06F 13/4221; G06F 13/423; G06F 13/4265; G06F 13/4273; G06F 13/4278; G06F 13/4282; G06F 13/4291; G06F 13/4295; G06F 11/141; G06F 3/023; H03M 5/02; H03M 5/04; H03M 5/08; H04L 25/493
See application file for complete search history.

(56) References Cited

U.S. PATENT DOCUMENTS

| 5,315,299 | A | * | 5/1994 | Matsumoto | H03M 5/145 341/53 |
| 6,064,697 | A | * | 5/2000 | Yoshikawa | H03M 5/145 375/242 |
| 6,232,796 | B1 | | 5/2001 | Batra et al. | |
| 6,809,664 | B1 | | 10/2004 | Pereira | |
| 9,110,133 | B2 | | 8/2015 | Wang et al. | |
| 9,742,431 | B1 | | 8/2017 | Babin | |

(Continued)

OTHER PUBLICATIONS

A Rate-Transparent, Self-Clocking Line Code, Paul R. Pruncal and Philippe A. Perrier, Proceedings of the IEEE, vol. 75, No. 8, Aug. 1987, pp. 1123-1125.

(Continued)

*Primary Examiner* — Thomas J. Cleary
(74) *Attorney, Agent, or Firm* — Rajeev Madnawat

(57) ABSTRACT

Embodiments are directed to apparatuses and methods involving communication between a first circuit and a second circuit over a wired-data bus. An example apparatus includes an integrated circuit (IC) chip within one of the first and second circuits and a logic circuit. The IC has a first data-communication port and a second data-communication for connection to respective first and second conductors of the wired-data bus. The logic circuit communicates a code multi-bit word out of a set of code multi-bit words over the wired-data bus by using signal transitions communicated on the first and second conductors. The code multi-bit word conveys clocked data bits indicated by the signal transitions, and information unique relative to other ones of the set of code multi-bit words by a known sequential pattern of the signal transitions defined relative to timing associated with the clocked data bits.

20 Claims, 8 Drawing Sheets

(56) References Cited

U.S. PATENT DOCUMENTS

2003/0016056 A1\* 1/2003 Matsuzaki .............. H03M 5/02
326/86
2015/0104673 A1\* 4/2015 de Greef ............... H04L 12/437
429/7

OTHER PUBLICATIONS

Data Sheet CAT25M01 EEPROM Serial 1-Mb SPIN (Jun. 2018).
Data Sheet TMP106 (Jan. 2006).

\* cited by examiner

| Number represented | Order of signal edges | |
|---|---|---|
| 0 | wire1, wire1, wire2 | |
| 1 | wire1, wire2, wire1 | |
| 2 | wire1, wire2, wire2 | |
| 3 | wire2, wire1, wire1 | |
| 4 | wire2, wire1, wire2 | |
| 5 | wire2, wire2, wire1 | |

FIG. 3B

WIRED-DATA BUS TRANSMISSION USING SIGNAL TRANSITION CODING

OVERVIEW

Aspects of various embodiments are directed to transmission of data over a wired-data bus using signal transitions for coding.

For data transmissions to and/or from integrated circuits (ICs) and other circuitry, data rates above a threshold are often used. Low pin count and limited input/output (I/O) bandwidth of the band cells can form a bottleneck, which can use a transmission protocol with high channel capacity. While dedicated high-speed I/O standards, such as Ethernet, permit data rates of several (10-1000) Megabits (MBits)/second, many ICs do not have such HSIO interfaces, but only a number of standard digital I/O pads.

These and other matters have presented challenges to efficiencies of wired-data bus transmission implementations, for a variety of applications.

SUMMARY

Various example embodiments are directed to issues such as those addressed above and/or others which may become apparent from the following disclosure concerning communicating data between data circuits using signal transitions for coding.

In certain example embodiments, aspects of the present disclosure involve coding words using the order of signal transitions on a two-wire data bus. The data is self-clocking and does not use an external clock for clock recovery at the receiver.

In a more specific example embodiment, an apparatus for communicating data between a first circuit and second circuit over a wired-data bus includes an integrated circuit (IC) chip and a logic circuit. The IC chip is within at least one of the first and second circuits and has a first data-communication port and a second data-communication port for connection to respective first and second conductors of the wired-data bus. Each of the first and second circuits can be ICs, printed circuit boards (PCBs) equipped with discrete or integrated circuits, or circuits forming part of an IC, as further described herein. The logic circuit is within and part of the IC chip and coupled to the first and second data-communication ports for communicating a code multi-bit word out of a set of code multi-bit words over the wired-data bus by using signal transitions communicated on the first and second conductors. The code multi-bit word conveys clocked data bits indicated by the signal transitions and information unique relative to other ones of the set of code multi-bit words by a known sequential pattern of the signal transitions defined relative to timing associated with the clocked data bits and used to differentiate individual ones of the clocked data bits.

The apparatus can further include a bus-driver circuit and a clock timing circuit that generates a clock drive signal for sending data bits over the wired-data bus. The data bits can be sent at a rate of between approximately 10 MHz and 50 MHz for a channel capacity of the wired-data bus that is at least 2.5 bits per cycle and not greater than 2.75 bits per cycle, although embodiments are not so limited. The bus-driver circuit is arranged as part of the IC chip and sends the code multi-bit word as clocked data bits over the wired-data bus according to timing defined by the clock circuit. For example, the bus-driver circuit and the clock-timing circuit can generate a clock drive signal, for sending data bits over the wired-data bus, with a signal-transition clock rate that is continuous. In other embodiments and/or in addition, the apparatus further includes a bus-receiver circuit, wherein the IC chip (or another IC chip) receives the code multi-bit word over the wired-data bus via the bus-receiver circuit, and discerns each of the clocked data bits by detecting the signal transitions. The code multi-bit word and the corresponding known sequential pattern of the signal transitions are defined to permit overall channel skewing, as further described herein, of the signal transitions relative to the first and second conductors of the wired-data bus, by as much as twenty percent of a time span corresponding to two consecutive junctures respectively corresponding to permissible times for the signal transitions.

In a number of embodiments, the apparatus further includes a look-up table and/or a look-up data circuit including information for associating each of the known sequential patterns of the signal transitions with the set of code multi-bit words. The code multi-bit word (e.g., each of the set of code multi-bit words) is represented by the signal transitions, as opposed to signal states between edges of signals carried by the first and second conductors of the wired-data bus. The code words are coded by sequential patterns of signal transitions that are generated based on a variety of rules. For example, for at least one of the set of code multi-bit words, one or more of the known sequential patterns of the signal transitions include individual ones of the clocked data bits without a signal transition. As another example, for the code multi-bit word, one of the known sequential patterns of the signal transitions starts without a signal transition and while the signal state associated with the first conductor corresponds to first binary logic state. For the another code multi-bit word, another of the known sequential patterns of the signal transitions starts without a signal transition and while the signal state associated with the first conductor corresponds to second binary logic state. As another example, the code multi-bit word is conveyed over the wired-data bus in one cycle of a discrete number of times, each of the times associated with a juncture at which a permissible one of the signal transitions can occur. The times associated with junctures at which permissible ones of the signal transitions can occur exclude junctures corresponding to the start of the code multi-bit word and also at the end of the code multi-bit word. In other embodiments and/or in addition, the times associated with the junctures at which permissible ones of the signal transitions can occur exclude a juncture corresponding to a signal transition on the first conductor of the wired-data bus aligning with a juncture corresponding to a signal transition on the second conductor of the wired-data bus.

In various embodiments, the logic circuit communicates the code multi-bit word over the wired-data bus according to a protocol permitting one cycle of bits for each code multi-bit word, with each code multi-bit word represented by three edges in the cycle, and with not more than six possible code multi-bit words. For example, the logic circuit can communicate at least the code multi-bit word over the wired-data bus according to the protocol permitting one cycle of bits for each code multi-bit word, with each code multi-bit word of the set of code multi-bit words represented by three edges in the cycle, and with exactly six possible code multi-bit words. The apparatus can further include a code-word detection circuit within the IC chip for comparing bits received over the wired-data bus with the known sequential patterns. In other embodiments, the logic circuit communicates at least the code multi-bit word over the wired-data bus according to the protocol permitting for a plurality of cycles of bits for each code multi-bit word in the set, with each code multi-bit word of the set of code multi-bit words represented by the same number of edges in each cycle, and with more than six possible code multi-bit words in the set. Although embodiments are not so limited and the logic circuit can communicate at least the code multi-bit word of the set over the wired-data bus according to the protocol permitting each code multi-bit word of the set to be represented by the same number of edges in each cycle or can communicate at least the code multi-bit word over the wired-data bus according to a protocol permitting the code multi-bit word(s) to be represented by a number of code bits being greater than three and not greater than eight, and being conveyed over a number of cycles that is at least two and not greater than eight.

In another specific example embodiment, an apparatus for communicating data between first and second circuits over a wired-data bus includes an IC chip, a logic circuit, and a code-word detection circuit. The IC chip has a first data-communication port and a second data-communication port, and a bus-receiver circuit for connection to respective first and second conductors of the wired-data bus. The logic circuit is configured and arranged within and as part of the IC chip. The logic circuit is communicatively coupled to the first and second data-communication ports of the wired-data bus, and receives code multi-bit words out of a set of code words over the wired-data bus by detecting signal transitions communicated on the first and second conductors. As described above, each code multi-bit word conveys clocked data bits indicated by the signal transitions and conveys information unique relative to other ones of the set of code multi-bit words by a set of known sequential patterns of the signal transitions defined relative to timing associated with the clocked data bits and used to differentiate individual ones of the clocked data bits. The code-word detection circuit detects received ones of the code multi-bit words by recovering the timing associated with the clocked data bits, and based on the recovered timing, by validating the received ones of the code multi-bit words by comparison to the set of known sequential patterns of the signal transitions. In various embodiments, the apparatus further includes the wired-data bus, the first circuit that includes the IC chip, a second circuit including a bus-driver circuit coupled to the wired-data bus, and a clock timing circuit cooperatively arranged with the bus-driver circuit to send the code multi-bit words as clocked data bits over the wired-data bus for differentiating individual ones of the clocked data bits.

Other specific example embodiments are directed to methods involving communicating data between a first circuit and second circuit over a wired-data bus. An example method includes operating an IC chip in at least one of the first and second circuits by communicating information through a first data-communication port and a second data-communication port of the IC chip and through respective first and second conductors of the wired-data bus. The method further includes using logic circuitry within and as part of the IC chip to communicate code multi-bit words of a set of code multi-bit words over the wired-data bus by using signal transitions communicated on the first and second conductors. As previously described, each of the code multi-bit words conveys clocked data bits indicated by the signal transitions and information unique relative to other ones of the code multi-bit words by a known sequential pattern of the signal transitions defined relative to timing associated with the clocked data bits and used to differentiate individual ones of the clocked data bits.

The above discussion/summary is not intended to describe each embodiment or every implementation of the present disclosure. The figures and detailed description that follow also exemplify various embodiments.

BRIEF DESCRIPTION OF FIGURES

Various example embodiments may be more completely understood in consideration of the following detailed description in connection with the accompanying drawings, in which:

FIGS. 3A-3B illustrate example coded multi-bit words, in accordance with the present disclosure;

Figure 1:
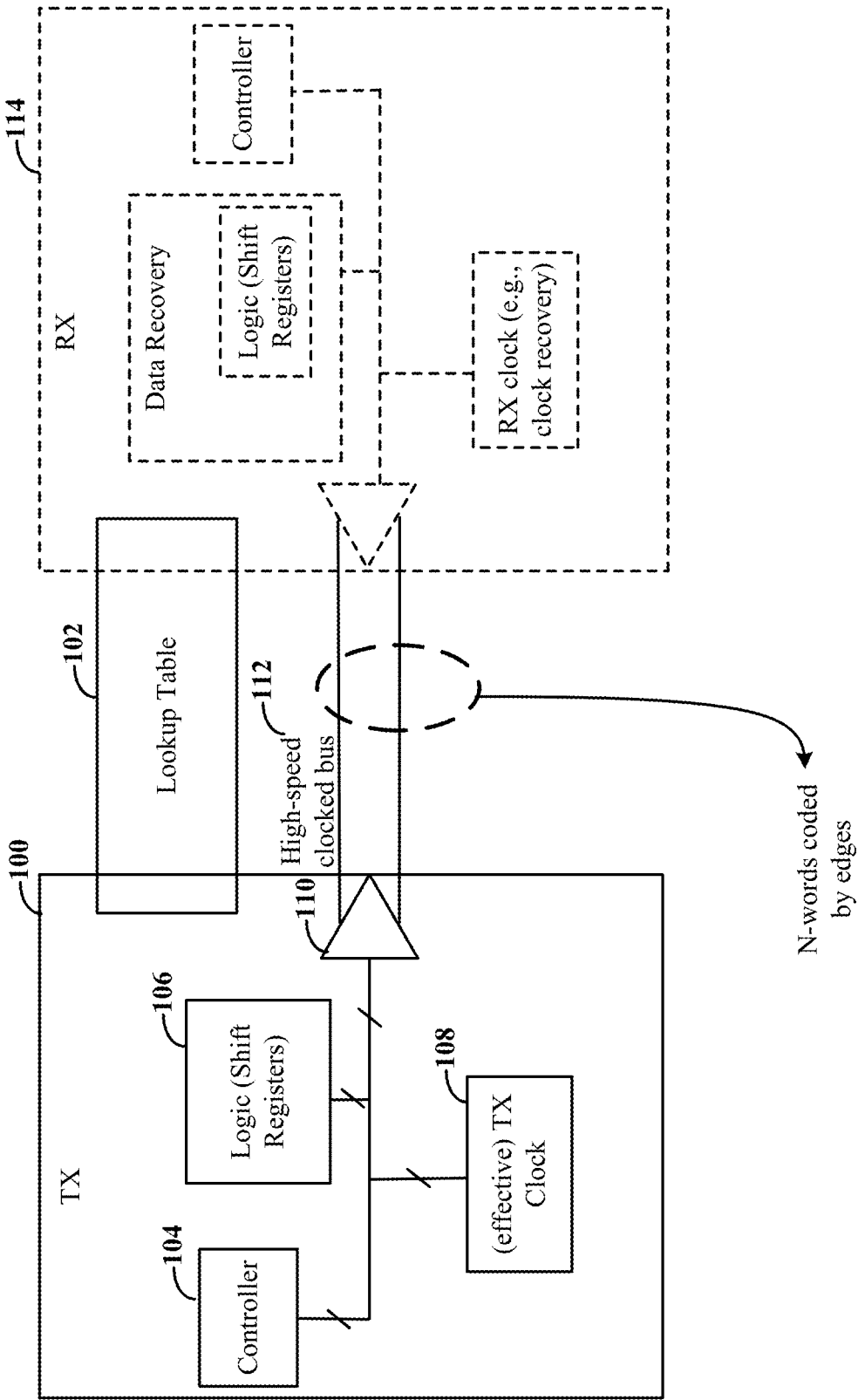
FIG. 1 is an example of an apparatus for communicating data between first and second circuits, in accordance with the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving data transmissions to and/or from circuits over a wired-data bus by coding words using signal transitions. In certain implementations, aspects of the present disclosure have been shown to be beneficial when used in the context of coding and corresponding data interfaces that use the order of signal transitions on a two-wire data bus with the data being self-clocking. While not necessarily so limited, various aspects may be appreciated through the following discussion of non-limiting examples which use exemplary contexts.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

For data transmissions to and/or from integrated circuits (ICs) and other circuitry, data rates above a threshold are often used. Low pin count and limited input/output (I/O) bandwidth of the pad cells can form a bottleneck, which can use a transmission protocol with high channel capacity. While dedicated high-speed I/O (HSIO) standards, such as Ethernet, permit data rates of several (e.g., 10-1000) Megabits (MBits)/second, many ICs in the field do not have such HSIO interfaces, but only have standard digital I/O pads that allow cycles times in the 10-100 nanosecond range. In accordance with various embodiments, the timing mismatch between I/O cells can be small, such as less than five percent of the cycle time. If the signals of two inputs change their state with at least a $\Delta T$ time difference, the IC can detect which input changes first and which changes last, provided that $\Delta T$ is at least ten percent of the cycle time. This allows for transmitting additional information within the given I/O cell bandwidth. Embodiments in accordance with the present disclosure are directed to a two-wire data transmission solution that offers channel capacities of 2.5 bits/cycles or more. For example, embodiments are directed to coding and corresponding data interfaces that use the order of signal transitions on a two-wire data bus. The data is self-clocking and does not use a phase-locked loop (PLL) or similar circuitry for clock recovery at the receiver, hence being completely sequential. The data transmission offers a higher data rate compared to dual data rate (DDR) two-wire bus solutions.

Transferring data over a two-wire data bus at the above-described channel capacity can be used in a variety of applications, such as inter-IC data transfers, data transfers to access on-chip instruments via a standard of the Institute of Electrical and Electronic Engineers (IEEE) 1687 compliant interface, and a scan test. In specific embodiments, the channel capacity can be achieved by edge stealing, clock recovery at the receiver, using signal transitions instead of signal states for coding, and/or varying the order the signal transitions. A signal transition, as used herein, includes or refers to a changing state of the signal, and which may include or interchangeably be referred to as a signal edge. As may be appreciated, a signal edge is a transition in a signal from either low to high (0 to 1) or high to low (1 to 0) and which results in an edge at such transition points. Edge stealing can allow for transferring additional information by selectively leaving out signal edges/signal transitions. Clock recovery at the receiver can include or refer to not transferring a dedicated clock with the data bits being captured as a self-clocked code (and not a dedicated clock edge). The signal transitions, rather than signal states, are used for coding. Data bits are captured at the receiver by taking into account the order of signal transitions at the two wires, without considering the time of the signal transition or if the transition is a failing or rising edge. Varying the order of the signal transitions of the two signals can allow for use of the timing discrimination capabilities of the receiver. This can allow for the signal to start at either state (e.g., 0 or 1) at the start of the code word. As such, the order of the signal transitions can vary while still coding for the same code word and the signals do not have to return to a state (e.g., 0) at the end of the cycle. Furthermore, no permanent clock wire is needed, which can reduce electromagnetic emissions that are concentrated on a few spectral lines.

In accordance with various embodiments, data is communicated between two circuits using a wired-data bus having two conductors (e.g., two wires). The first circuit can include a transmitter (TX) that transmits data to the second circuit that includes a receiver (RX). The TX can be an IC or a production tester and the RX can be an IC, although embodiments are not so limited and the first and second circuits can include printed circuit boards (PCBs) with discrete and/or ICs mounted on them, and other circuitry, and can include additional circuits such as more than one RX. The wired-data bus is used to communicate data at a channel capacity of at least 2.5 bits/cycle using a set of multi-bit code words (herein referred to generally as "code words" for ease of reference) that follow a number of rules. Such rules can include, on the TX end, each cycle has discrete times T1, T2, T3, and T4 where a signal transition can occur. In some specific examples, a signal transition may not occur at either wire of the wired-data bus at the beginning or end of a cycle, e.g., before T1 or after T4. The cycle, as further described herein, is for communicating a code word. The discrete times include or refer to times associated with junctures at which signal transitions can occur. Additionally, no signal on a respective wire can have a signal transition at both T3 and T4, but can have a signal transition at both T2 and T3. Further, in some embodiments, signals on both wires cannot transition at the same time and can have either one or two signal transitions in one cycle. The above can be due to the time between the discrete times T2 and T3 being longer than the time between (T1 and T2) and (T3 and T4). As described above, each signal can start at any state (e.g., 0 or 1) into a new cycle as the signal transitions, not signal states convey the information. The status of a signal thereby does not need to change from the end of one cycle to the beginning of the next cycle.

In specific example embodiments, an apparatus for communicating data between a first circuit and a second circuit over a wired-data bus includes an IC chip and a logic circuit. The IC chip is within at least one of the first and second circuits, and includes a first data-communication port and a second data-communication port for connection to respective first and second conductors of the wired-data bus. The logic circuit is within and part of the IC chip and coupled to the first and second data-communication ports for communicating a code word out of a set of code words over the wired-data bus by using signal transitions communicated on the first and second conductors. The code word conveys clocked data bits indicated by the signal transitions and information unique relative to other ones of the set of code multi-bit words by a known sequential pattern of the signal transitions defined relative to timing associated with the clocked data bits and used to differentiate individual ones of the clocked data bits.

The apparatus can further include a bus-driver circuit and a clock timing circuit that generates a clock drive signal for sending data bits over the wired-data bus. The bus-driver circuit is arranged as part of the IC chip and configured to send the code word(s) as clocked data bits over the wired-data bus according to timing defined by the clock circuit. For example, the bus-driver circuit and the clock-timing circuit can generate a clock drive signal, for sending data bits over the bus, with a signal-transition clock rate that is continuous. The data bits can be sent at a rate of between 10 MHz and 50 MHz for a channel capacity of the wired-data bus that is at least 2.5 bits per cycle and not greater than 2.75 bits per cycle, although embodiments are not so limited. In other embodiments and/or in addition, the apparatus further includes a bus-receiver circuit, wherein the IC chip (or another IC chip) receives the code word(s) over the wired-data bus via the bus-receiver circuit, and discerns each of the clocked data bits by detecting the signal transitions. The code words of the set and the corresponding known sequential patterns of the signal transitions are defined to permit overall channel skewing, as further described herein, of the signal transitions relative to the first and second conductors of the wired-data bus, by as much as twenty percent of a time span corresponding to two consecutive junctures respectively corresponding to permissible times for the signal transitions.

In a number of embodiments, the apparatus further includes a look-up table and/or a look-up data circuit including information for associating each of the known sequential patterns of the signal transitions with the set of code words. The code word (e.g., each of the set of code multi-bit words) is represented by the signal transitions, as opposed to signal states between edges of signals carried by the first and second conductors of the wired-data bus. The code words are coded by sequential patterns of signal transitions that are generated based on a variety of rules, such as those previously described. For example, for at least one of the set of code words, one or more of the known sequential patterns of the signal transitions include individual ones of the clocked data bits without a signal transition at one of the conductors. As another example, for the code word, one of the known sequential patterns of the signal transitions starts without a signal transition at one of the conductors and while the signal state associated with the first conductor corresponds to first binary logic state and for another code word, another of the known sequential patterns of the signal transitions starts without a signal transition and while the signal state associated with the first conductor corresponds to second binary logic state. As another example, the code word is conveyed over the wired-data bus in one cycle of a discrete number of times, each of the times associated with a juncture at which a permissible one of the signal transitions can occur. The times associated with junctures at which permissible ones of the signal transitions can occur can exclude junctures corresponding to the start of the code word and also at the end of the code word. In other embodiments and/or in addition, the times associated with the junctures at which permissible ones of the signal transitions can occur exclude a juncture corresponding to a signal transition on the first conductor of the wired-data bus aligning with a juncture corresponding to a signal transition on the second conductor of the wired-data bus.

In various embodiments, the logic circuit communicates the code word over the wired-data bus according to a protocol permitting one cycle of bits for each code word, with each code word represented by three edges in the cycle, and with no more than six possible code words in the set. For example, the logic circuit can communicate at least the code word over the wired-data bus according to a protocol permitting one cycle of bits for each code word, with each code word of the set of code words represented by three edges in the cycle, and with exactly six possible code words in the set. The apparatus can further include a code-word detection circuit within the IC chip configured for comparing bits received over the wired-data bus with the known sequential patterns. In other embodiments, the logic circuit communicates at least the code word over the wired-data bus according to a protocol permitting for a plurality of cycles of bits for each code word in the set, with each code word of the set of code words represented by the same number of edges in each cycle, and with more than six possible code words in the set. Although embodiments are not so limited and the logic circuit can communicate at least the code word over the wired-data bus according to a protocol permitting each code word being represented by the same number of edges in each cycle or can communicate at least the code word over the wired-data bus according to a protocol permitting the code word(s) to be represented by a number of code bits being greater than three and not greater than eight, and being conveyed over a number of cycles that is at least two and not greater than three.

In other specific example embodiments, an apparatus for communicating data between first and second circuits over a wired-data bus includes an IC chip, a logic circuit, and a code-word detection circuit. The IC chip has a first data-communication port and a second data-communication port, and a bus-receiver circuit for connection to respective first and second conductors of the wired-data bus. The logic circuit is configured and arranged within and as part of the IC chip. The logic circuit is communicatively coupled to the first and second data-communication ports of the wired-data bus, and receives code words out of a set of code words over the wired-data bus by detecting signal transitions communicated on the first and second conductors. As described above, each of code words conveys clocked data bits indicated by the signal transitions and information unique relative to other ones of the set of code multi-bit words. The code-word detection circuit detects received ones of the code words by recovering the timing associated with the clocked data bits, and based on the recovered timing, validating the received ones of the code words by comparison to the set of known sequential patterns of the signal transitions. In various embodiments, the above described apparatus can further include the wired-data bus, the first circuit that includes the IC chip, a second circuit including a bus-driver circuit coupled to the wired-data bus, and a clock timing circuit cooperatively arranged with the bus-driver circuit to send the code words as clocked data bits over the wired-data bus for differentiating individual ones of the clocked data bits.

A variety of embodiments are directed to methods involving communicating data between a first circuit and a second circuit over a wired-data bus. An example method includes operating an IC chip in at least one of the first and second circuits, by communicating information through a first data-communication port and a second data-communication port of the integrated circuit chip and through respective first and second conductors of the wired-data bus. The method further includes using logic circuitry within and as part of the IC chip, to communicate code words of a set of code words over the wired-data bus by using signal transitions communicated on the first and second conductors. As previously described, each of the code words conveys clocked data bits indicated by the signal transitions and information unique relative to other ones of the code words by a known sequential pattern of the signal transitions defined relative to timing associated with the clocked data bits and used to differentiate individual ones of the clocked data bits.

The above described data communication can be used to achieve data rates which exceed the data rate of DDR two-wire buses, enhance error correction and/or detection capabilities, allows for bus pins to be shared with functional pins, allows for the bus to be used for programming and reading on-chip instruments in both production testing and in-field applications, allows for varied data rates and/or special code meetings. Additionally, as the above-embodiments allow for avoiding an external continuously-running clock wire, lower electromagnetic interference and lower energy consumption can be achieved as compared to use of a clock wire.

Turning now to the figures, FIG. 1 is an example of an apparatus for communicating data between first and second circuits, in accordance with the present disclosure. The apparatus is used for communicating data between a first circuit 100 and a second circuit 114 over a wired-data bus 112. In various embodiments, the apparatus includes the first circuit 100, the second circuit 114, or the first circuit 100 and the second circuit 114. With respect to the two-wire bus, the first circuit 100 is a transmitter (TX) and the second circuit 114 is a receiver (RX).

In a number of embodiments, the apparatus includes an IC chip within at least one of the first and second circuits 100, 114. The IC chip has a first data-communication port and a second-data communication port that connect to respective first and second conductors (e.g., wires) of the wired-data bus 112 (e.g., as illustrated by the bus-driver circuit 110). The wired-data bus 112 is a high-speed clocked bus having the first and second conductors and that can be used to convey N-words coded by signal edges or transitions. The logic circuit 106 can include a plurality of shift-registers, such as flip flop circuits as further described herein.

The apparatus can further include a controller circuit 104. The controller circuit 104 can control the logic circuit 106 to communicate data bits over the wired-data bus 112 using a particular code protocol. The code protocol can be used to communicate code words using a plurality of rules and to convey the data bits. For example, a code word conveys clocked data bits indicated by signal transitions and information unique relative to other ones of the set of code words. The clocked data bits are captured at the RX (e.g., second circuit 114) without the use of a dedicated clock edge by capturing the self-clocking code and by taking into account the order of signal transitions on the first and second conductors. The coding can be independent (e.g., does not take into account) of the time of the signal transitions and independent of whether the signal transitions are associated with a rising or falling signal edge. The information is conveyed by a known sequential pattern of signal transitions (of signals on the first and second conductors) defined relative to a timing associated with the clocked data bits and used to differentiate between individual ones of the clocked data bits.

As illustrated by the embodiment of FIG. 1, the apparatus can include various additional components, such as a bus-driver circuit 110 and a clock timing circuit 108 that generates a clock drive signal for sending data bits over the wired-data bus 112. The bus-driver circuit 110 can be arranged as part of the IC chip (e.g., the IC chip of the first circuit 100 which is acting as a TX) and used to send the code word(s) as clocked data bits (which are self-clocked without a dedicated clock edge) according to a timing defined by the clock timing circuit 108. In specific embodiments, the clock timing circuit 108 is cooperatively arranged with the bus-driver circuit 110 to send the code multi-bit words as clocked data bits over the wired-data bus 112 for differentiating individual ones of the clocked data bits.

Each of the code words of the set correspond to a known sequential pattern of signal transitions associated with the wired-data bus 112. The timing defined by the clock timing circuit 108 can include a cycle having discrete times where a signal transition can occur (as further illustrated by the timing diagram of FIG. 3A). The cycle includes to or refers to the time (T) for communicating one or two signal transitions as part of a code word. The words are communicated according to rules, as described above and further below in connection with FIG. 3A.

Alternatively and/or in addition, the apparatus can include the second circuit 114 acting as a RX and that includes an IC chip as described above. The apparatus can include a bus-receiver circuit that is part of the IC chip of the second circuit 114. The IC chip of the second circuit 114 can receive the code word (or multiple code words) over the wired-data bus 112 via the bus-receiver circuit and can discern each of the clocked data bits by detecting signal transitions. The second circuit 114 can include a code-word detection circuit within the IC chip that compares data bits received over the wired-data bus 112 with the known sequential patterns. The code-word detection circuit, which can include the illustrated data recovery and clock recovery circuitry, can detect received signal transitions of the code multi-bit words by recovering the timing associated with the clocked data bits, and based on the recovered timing, validating the received signal transitions of the code multi-bit words by comparison to the set of known sequential pattern of the signal transitions.

In various embodiments, the TX and/or the RX further includes a look-up table 102 which may be stored on a separate look-up data circuit, on the controller circuit 104, and/or on another circuit of each of the first and second circuits 100, 114. The look-up table 102 includes information for associating each of the known sequential patterns of the signal transitions with the set of code words. In specific embodiments, the code words and the corresponding known sequential patterns of the signal transitions are defined to permit overall channel skewing of the signal transitions relative to the first and second conductors of the wired-data bus 112, by as much as twenty percent of a time span corresponding to two consecutive junctures respectively corresponding to permissible times for the signal transitions. Channel skewing includes or refers to a worst-case timing misalignment between the conductors (e.g., wire 1 and wire 2) plus the worst-case jitter.

In accordance with various embodiments, the code words are communicated via the known sequential patterns of signal transitions that comply with a plurality of rules. Such rules allow for achieving the channel capacity of more than 2.5 bits/cycle by edge stealing, clock recovery at the receiver, use of signal transitions for coding, and varying the order of the signal transitions. A code word can be conveyed over the wired-data bus in one cycle of a discrete number of times, each of the times associated with a juncture at which a permissible one of the signal transitions can occur. For example, for each of the first and second conductors of the wired-data bus 112, the times associated with junctures at which permissible ones of the signal transitions can occur can exclude junctures corresponding to transitions at the start of the code word (each cycle) and also at the end of each code word. Further, the times associated with junctures can exclude two sequential ones of the signal at particular times but not at others (e.g., cannot have two sequential signal transitions for a respective wire at (T1 and T2) or (T3 and T4) but can at T2 and T3). Additionally, the times associated with the junctures at which permissible ones of the signal transitions can occur can exclude a juncture corresponding to a signal transition on the first conductor of the wired-data bus aligning with a juncture corresponding to a signal transition on the second conductor of the wired-data bus (e.g., the two signals cannot transition at the same time), although embodiments are not so limited. Each signal can also have one or two edges in one cycle, and as further described herein, can start at either signal state (e.g., 0 or 1) at the new cycle as the signal transitions, not the signal states, convey the information.

As previously described, the apparatus further includes a logic circuit 106 that is within and part of the IC chip. The logic circuit can include shift registers, such as flip-flip circuits. The logic circuit 106 is communicatively coupled to the first and second data-communication ports and is used to communicate the code word out of the set of code words. In some embodiments, the set of code words can include six words, eight words, fifty words, or more words, which can be communicated over the wired-data bus 112 by using signal transitions communicated on the first and second conductors. The logic circuit 106 communicates the code word over the wired-data bus 112 according to the protocol, as described above, permitting one cycle of bits for each code word.

In various specific embodiments, each of the first and second circuits 100, 114 are an IC, a combination of discrete and/or ICs on a PCB, or a circuit forming part of an IC. For example, the first and second circuits 100, 114 can include PCBs that each have a plurality of ICs and are coupled by a wired-data bus 112 via a back plane. In other embodiments, each of the first and second circuits 100, 114 are within an IC, such as in a Network-on-a-Chip (NoC).

Figure 2:
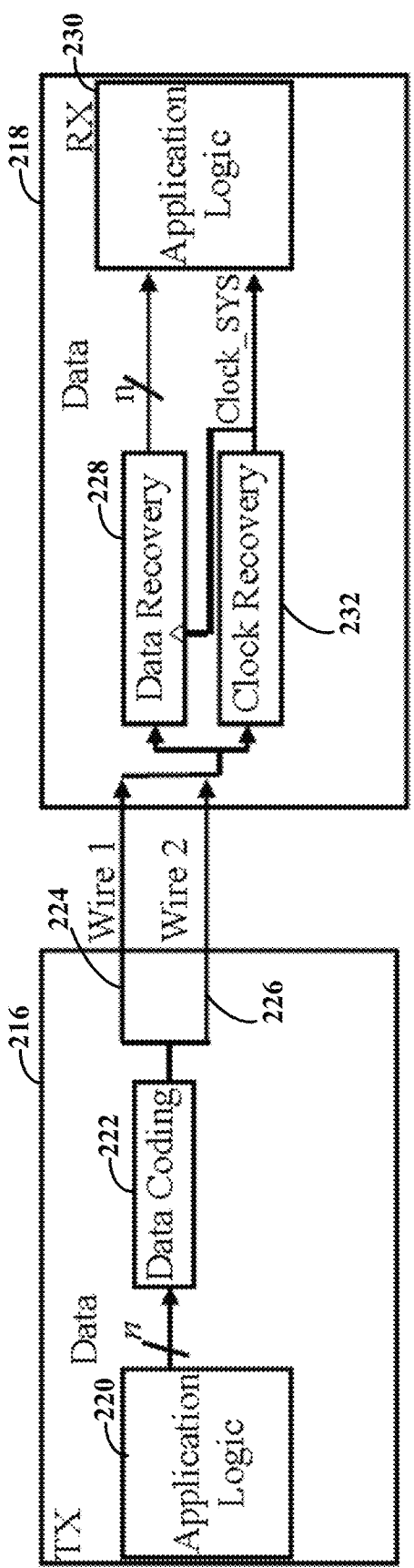
FIG. 2 is an example of an apparatus for communicating data between first and second circuits, in accordance with the present disclosure.

FIG. 2 is an example of an apparatus for communicating data between first and second circuits, in accordance with the present disclosure. The first and second data circuits 216, 218 can include ICs acting as a TX and RX, respectively.

The first circuit 216 includes application logic 220 for performing application functions and data coding circuitry 222. The data coding circuitry 222 includes the previously described logic circuit and, in some embodiment, clock timing circuit. As illustrated, the data coding circuitry 222 is coupled to the first wire 224 and second wire 226 (e.g., via bus-driver circuitry, not illustrated) for communicating code words to the second circuit 218.

The second circuit 218 includes data recovery circuitry 228, clock recovery circuitry 232 and application logic 230. The data recovery circuitry 228 and the clock recovery circuitry 232 can include the logic circuit and code-word detection circuitry used to receive code words over the first and second wires 224, 226, recover the timing associated with the clocked data bits, and based on the recovered timing, validate the received ones of the code words by comparison to the set of known sequential patterns of the signal transitions, as described above in connection with FIG. 1.

The components illustrated by FIG. 2 are described in further detail herein. Such data transmission from IC to IC can be used between a frontend IC sensing or receiving data, and a backend IC performing analysis of these data. Data transmission in accordance with the embodiments described herein can additionally or alternatively be used for system self-test in the field, where the application mode is interrupted in regular intervals and a central processing unit (CPU) accesses analog or mixed-signal instruments of another IC for verifying correct operation, e.g., using an IEEE 1687-compliant infrastructure. Although embodiments are not so limited and the above is provided as examples only.

Figure 3A:
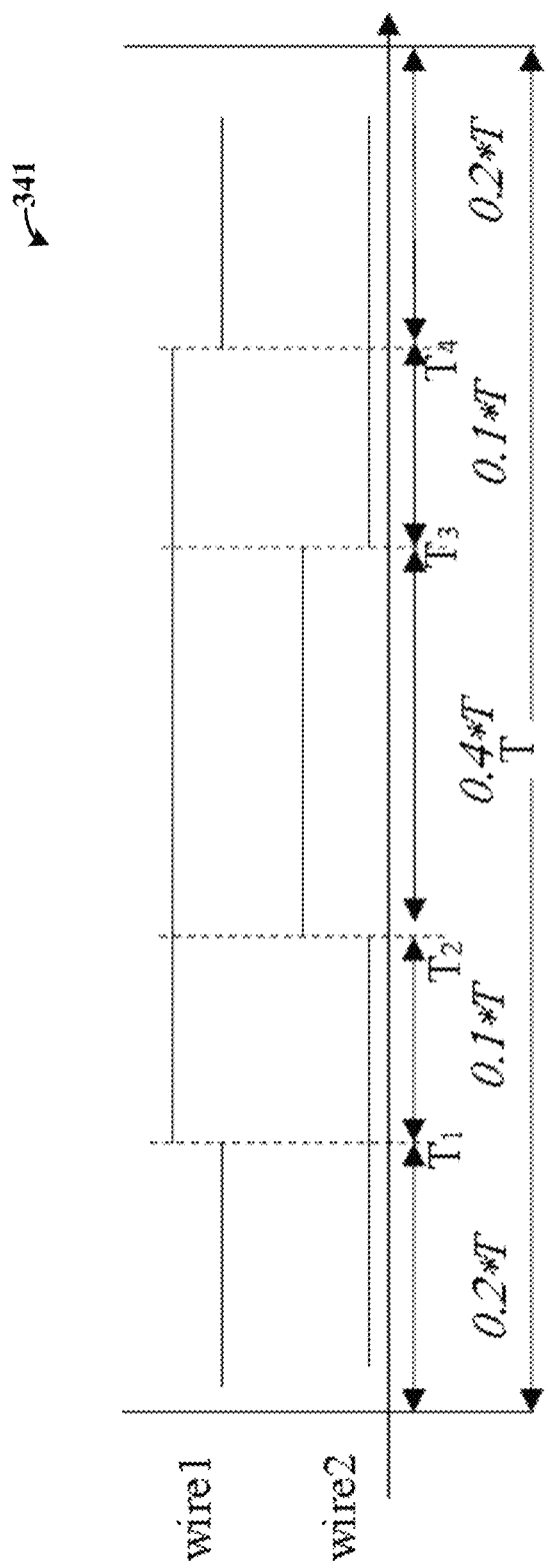

FIGS. 3A-3B illustrate example coded words, in accordance with the present disclosure. As previously described, code words can be communicated according to rules and which allows for high speed communication over a two-wire data bus. More specifically, FIG. 3A illustrates an example code word timing 341 of a two-wire data bus. The specific example of FIG. 3A shows the timing 341 with an example of wire 1 having its first signal edge at T1, and the second signal edge at T4. Wire 2 has its first signal edge at T2 and the second edge at T3. The order of signal edges is hence wire1, wire2, wire2, wire1 (i.e., 1, 2, 2, 1).

In accordance with various embodiments, due to the given degrees of freedom (e.g., number of edges per cycle being either two, three, or four; signal edges at T1 vs. T2 and T3 vs. T4), a channel capacity of 2.5-2.67 bits/cycle can be reached, compared to 1 bit/cycle of busses with a dedicated clock wire and one active clock edge (e.g., serial peripheral interface (SPI)) and 2 bits/cycle with DDR two-wire busses. In a number of specific embodiments, the data bits can be sent over the wired-data bus (e.g., two-wire bus) at a data rate between 10 MHz and 50 MHz, although embodiments are not so limited and can include rates of 100 kHz-1 MHz, and can achieve a channel capacity that is at least 2.5 bits per cycle and not greater than 2.75 bits per cycle. At 50 MHz, for example, there can be 2 ns between T1 and T2, and a maximum timing error of 0.4 ns considering both wires and the TX and RX.

The wired-data bus is used to communicate data at a channel capacity of at least 2.5 bits/cycle using the set of code words that follow a number of rules. In accordance with various embodiments, such rules can include that each cycle has discrete times T1, T2, T3, and T4 where a signal transition can occur. As shown by FIG. 3A, to respect I/O pad cells' timing constraints, the timing between the different discrete times is different (e.g., the time between T4 and the next T1 is 2×(0.2×T), whereas the time between T2 and T3 is 0.1×T). A signal transition may not occur at either wire of the wired-data bus at the beginning or end of a cycle, e.g., before T1 or after T4. Additionally, in some embodiments, no signal on a respective wire can have a signal transition at both T3 and T4, but can have a signal transition at both T2 and T3. In a number of embodiments, signals on both wires cannot transition at the same time. The above is due to the time between the discrete times T2 and T3 being longer than the time between (T1 and T2) and (T3 and T4). The two signals (on the respective two wires), in various embodiments, cannot have a signal transition at the same time and can have either one or two signal transitions in a cycle. As described above, each signal can start at any state (e.g., 0 or 1) in a new cycle. As the signal transitions, not signal states convey the information, the status of a signal does not need—and hence is not allowed to—change from the end of one cycle to the beginning of the next cycle.

In accordance with the above-described example rules, for at least one of the set of code words, the known sequential patterns of the signal transition include individual ones of the clock data bits without a signal transition at one of the conductors of the wired-data bus. Further, for one code word, the known sequential pattern of the signal transitions can start without a signal transition and while the signal state corresponds to first binary logic state, and wherein for the code word, sent a second time, the known sequential pattern of the signal transitions starts without a signal transition and while the signal state corresponds to second binary logic state (e.g., it is the same pattern each time, but that the signal edges are different in raising or failing state).

As may be appreciated, the I/O pad cells' timing constraints may be indicative of or caused by the slew rate of the IC driver pad cells, e.g., the driver strength of the output driver of the transmitting IC. The stronger the driver is, the faster it can charge/discharge the external wires to the receiver IC. Stronger drivers cost chip area, power (also quiescent power), but they also lead to more ground bounce that may disturb the digital circuitry and the analog circuitry. The slew rate can be intentionally reduced to prevent this. However, in a number of embodiments, as the two wires are not transitioned at the same time, the slew rate can be increased to a higher slew rate than the slew rate permissible if both wires were allowed to have an edge at the same time.

FIG. 3B illustrates an example code for six possible code words when using one cycle, in accordance with various embodiments. Also shown are the order-of-edges and the number represented by the code words. Each word in this example code is represented by three edges. The channel capacity in this example is $\log_2 (6)$ or about 2.58 bit per cycle. In such embodiments, each code word is represented by three edges in cycle, with exactly or no more than six possible code words in the set. As may be appreciated, the above described channel capacity is the information per pulse N in bit/pulse to the base-2 logarithm of the number of distinct code words M that can be communicated resulting in $N=\log_2(M)$.

Transferring one out of six possible code words per cycle may allow for coding two bits. There are applications that demand exactly six possible code words. Such an example application is the scan test with on-chip comparison. Here, one bit per scan chain is the input, while the output of the scan chain is either expected to be 0 or 1 ("Scan out expect"), or is undefined and shall therefore be masked ("Scan out mask") (see, Table 1 below). This leads to six different combinations, for which the six code words are a perfect match.

TABLE 1

| Scan in | Scan out expect | Scan out mask | Code word |
|---------|-----------------|---------------|-----------|
| 0 | 0 | 0 | 0 |
| 1 | 0 | 0 | 1 |
| 0 | 1 | 0 | 2 |
| 1 | 1 | 0 | 3 |
| 0 | 0 | 1 | 4 |
| 1 | 0 | 1 | 5 |

As may be appreciated, the above can apply for any other test with on-chip comparison, for which selectively output data may be masked out.

The example code illustrated by FIG. 3B and Table 1 is provided for illustrative purposes and is not intended to be limiting. For example, embodiments are not limited to sets of code words that include six possible code words, and the sets of code words can include six, thirty-six, fifty, three hundred, or more. In some embodiments, the logic circuit communicates at least the code word over the wired-data bus according to a protocol permitting for a plurality of cycles of bits for each code word in the set, with each code word of the set of code words represented by the same number of edges in each cycle, and with more than six possible code words in the set. Using the same coding scheme as described above in connection with FIGS. 3A-3B, but with two cycles appended, allows for 6*6=36 possible combinations, resulting in thirty-six possible code words. Using only thirty-two of the thirty-six code words allows coding five bits in one two cycles, hence the channel capacity of the two-wire bus is 2.5 bits per cycle.

In other embodiments, the logic circuit communicates at least the code word over the wired-data bus according to a protocol permitting each code word being represented by the same number of edges in each cycle. While in embodiments described above in connection with FIGS. 3A-3B, the code words have the same number of edges (e.g., three edges in FIG. 3A-3B, and 2*3=6 edges as described above), in other embodiments, a set of code words with different number of signals edges is used. As can be seen in the Table 2, fifty different code words are possible to be transmitted following the rules as described above. Having a different numbers of edges for different code words of the same code makes decoding the code word at the receiver somewhat more complex, and allows for transferring five bits using these fifty different code words. Some dedicated applications, in various embodiments, may use a set of fifty or nearly fifty different code words.

The logic circuit, in a number of embodiments, can communicate at least the code word over the wired-data bus according to a protocol permitting the code word(s) to be represented by a number of code bits being greater than three and not greater than eight, and being conveyed over a number of cycles that is at least two and not greater than three. Combining the embodiments described above can result in 6*50=300 different code words, allowing to code eight bits in three cycles. The channel capacity in such embodiments is as high as 8 bits/3 cycles or about 2.67 bits per cycle.

As previously described, the bus channel capacity of 2.5-2.67 (or more) bits per cycle for the proposed two-wire data bus can be higher than what is achieved with a two-wire bus using a dedicated clock wire, one data wire and a DDR code. For a two-wire implementation of SPI in which the data wire transfers one bit at the rising clock edge and one bit at the falling clock edge, the bus channel capacity is (only) two bits per cycle. As previously described, the proposed wired-data bus solution has an additional advantage of not having a continuous clock signal that can disturb other electronic devices in the proximity.

Table 2, as shown below, provides an example of coding different code words, although embodiments are not so limited and can include a variety of coding:

TABLE 2

| Code words within 2 cycles | | | | | |
|---|---|---|---|---|---|
| 5 edges | | 6 Edges | | 8 Edges | |
| 1,1,1 | 1,2 | 1,1,1 | 2,1,2 | 1,2,1,2 | 1,2,1,2 |
| 2,2,2 | 2,1 |  | 2,2,1 | 1,2,1,2 | 1,2,2,1 |
|  |  |  |  | 1,2,1,2 | 2,1,1,2 |
|  |  | 1,1,2 | 1,1,2 | 1,2,1,2 | 2,1,2,1 |
|  |  | 1,1,2 | 1,2,1 |  |  |
|  |  | 1,1,2 | 1,2,2 | 1,2,2,1 | 1,2,1,2 |
|  |  | 1,1,2 | 2,1,1 | 1,2,2,1 | 1,2,2,1 |
|  |  | 1,1,2 | 2,1,2 | 1,2,2,1 | 2,1,1,2 |
|  |  | 1,1,2 | 2,2,1 | 1,2,2,1 | 2,1,2,1 |
|  |  | 1,2,1 | 1,1,2 | 2,1,1,2 | 1,2,1,2 |
|  |  | 1,2,1 | 1,2,1 | 2,1,1,2 | 1,2,2,1 |
|  |  | 1,2,1 | 1,2,2 | 2,1,1,2 | 2,1,1,2 |
|  |  | 1,2,1 | 2,1,1 | 2,1,1,2 | 2,1,2,1 |
|  |  | 1,2,2 | 1,2,2 | 2,1,2,1 | 1,2,1,2 |
|  |  | 1,2,2 | 2,1,1 | 2,1,2,1 | 1,2,2,1 |
|  |  | 1,2,2 | 2,1,2 | 2,1,2,1 | 2,1,1,2 |
|  |  | 1,2,2 | 2,2,1 | 2,1,2,1 | 2,1,2,1 |
|  |  | 2,1,1 | 1,1,2 |  |  |
|  |  | 2,1,1 | 1,2,1 |  |  |
|  |  | 2,1,1 | 1,2,2 |  |  |
|  |  | 2,1,1 | 2,1,1 |  |  |
|  |  | 2,1,2 | 1,2,2 |  |  |
|  |  | 2,1,2 | 2,1,1 |  |  |
|  |  | 2,1,2 | 2,1,2 |  |  |
|  |  | 2,1,2 | 2,2,1 |  |  |
|  |  | 2,2,1 | 1,1,2 |  |  |
|  |  | 2,2,1 | 1,2,1 |  |  |
|  |  | 2,2,1 | 1,2,2 |  |  |

TABLE 2-continued

Code words within 2 cycles

| 5 edges | 6 Edges | 8 Edges |
|---|---|---|
| | 2,2,1 | 2,1,1 |
| | 2,2,1 | 2,1,2 |
| | 2,2,1 | 2,2,1 |
| | 2,2,2 | 1,1,2 |
| | 2,2,2 | 1,2,1 |

Figure 4:
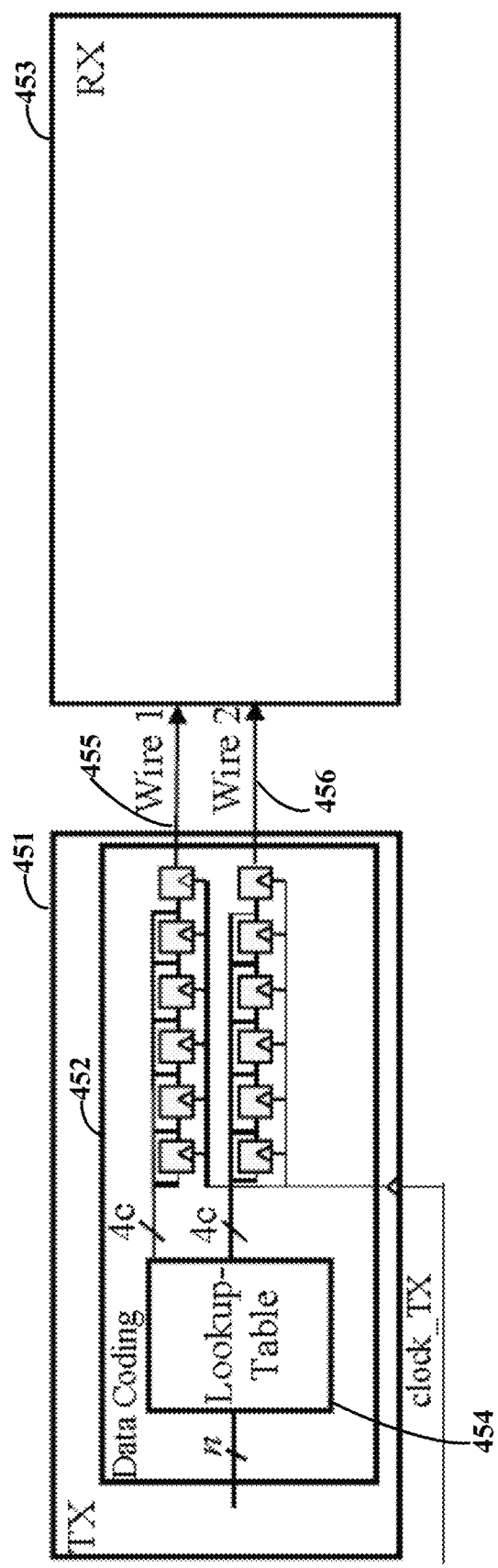
FIG. 4 illustrates an example of a data transmitting apparatus, in accordance the present disclosure.

FIG. 4 illustrates an example of a data transmitting apparatus, in accordance the present disclosure. As shown, the apparatus can include a first circuit 451 communicating to a second circuit 453 via a wired-data bus (e.g., wire 1 and wire 2 455, 456). More specifically, FIG. 4 illustrates components of the first circuit 451 that includes a TX. As shown by FIG. 4 and is consistent with the embodiment illustrated by FIG. 2, the TX includes data coding circuitry 452 that includes a look-up table 454 and logic circuits (e.g., the illustrated shift registers).

FIG. 4 shows an example of TX coding n data bits. The n data bits are fed into the look-up table 454 that for each of the $2^n$ combinations corresponding to code words contains the values of the wires for the times T1 . . . T4 of each of the c cycles. At the beginning of each code word, these values are loaded in parallel into the shift registers (each having a length of 4c) for each of the two wires, and then shifted out serially. The shift registers are clocked with a signal clock_TX that has rising edges at the times T1 . . . T4. Depending on the contents of the last flip-flop of each shift register, the respective wire is either toggled or not toggled (and as previously described, as coding is done by signal edges, not by signal states, the same code word can either start with a 0 or a 1, depending on the state of the wire at the end of the previous cycle).

Figure 5A:
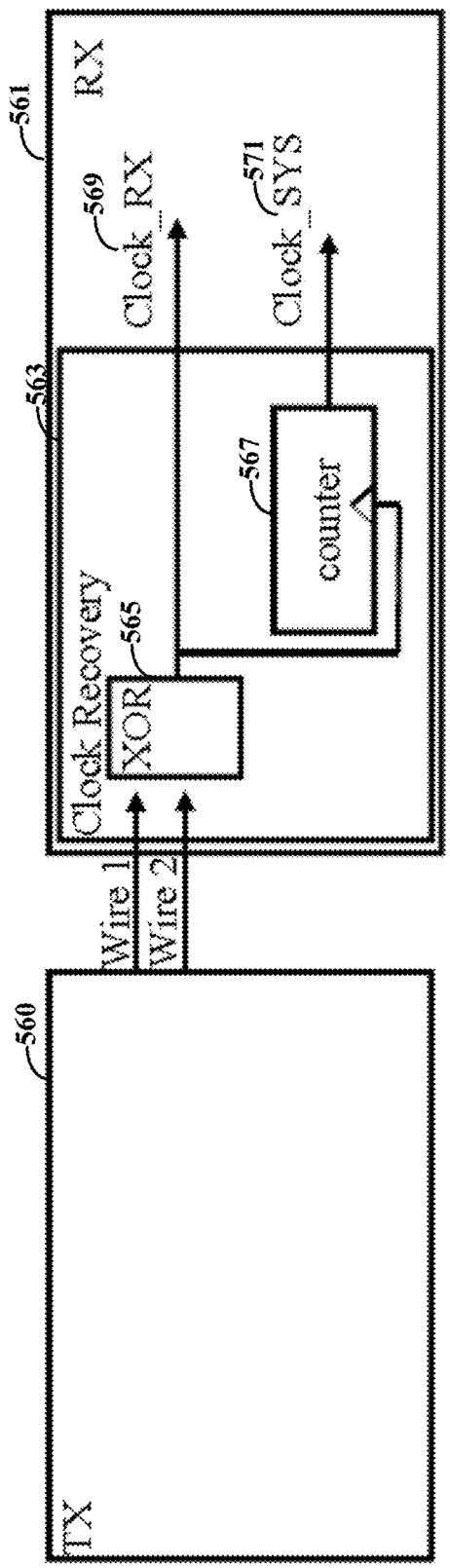
FIGS. 5A-5B illustrate examples of a data receiving apparatus, in accordance the present disclosure.
Figure 5B:
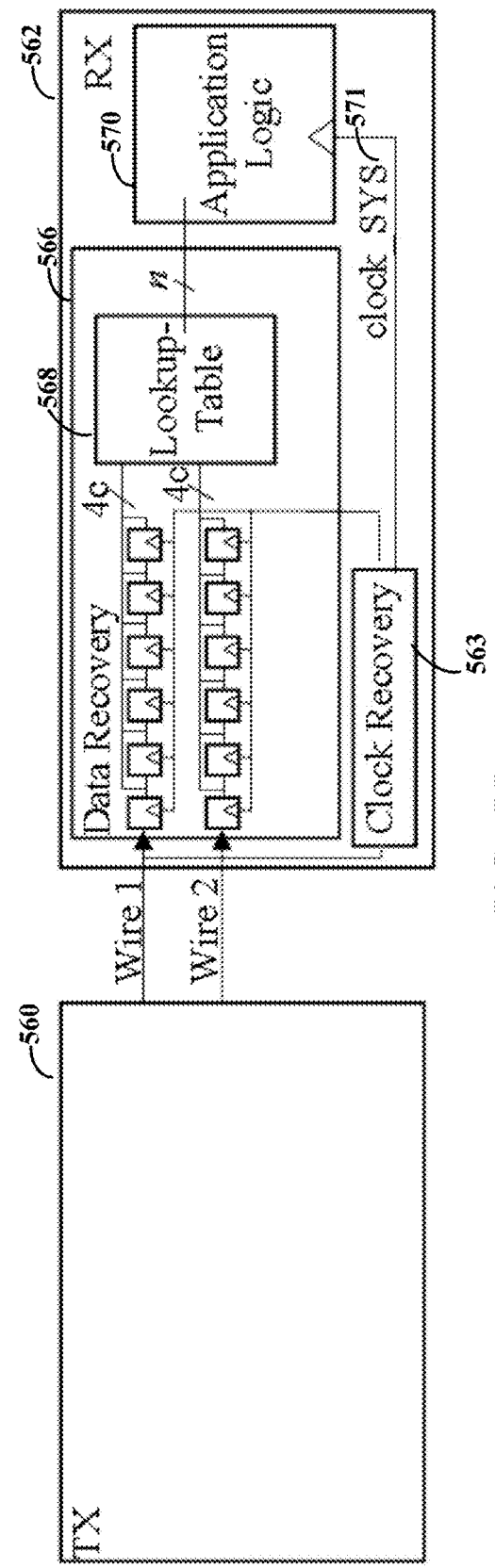

FIGS. 5A-5B illustrate examples of a data receiving apparatus, in accordance the present disclosure. As shown by FIGS. 5A-5B, the apparatus can include a first circuit 560 communicating to a second circuit 561 or 562 via a wired-data bus (e.g., wire 1 and wire 2). More specifically, FIGS. 5A and 5B illustrate components of the second circuit 561, 562 that includes a RX. Although the components are illustrated in separate second circuits 561, 562, embodiments include a second circuit having each of the components as illustrated specifically by FIGS. 5A and 5B.

As shown by FIG. 5A and is consistent with the embodiments illustrated by FIG. 2, the RX includes clock recovery circuitry 563. As the wired-data bus has no dedicated clock wire, the clock is recovered in the receiving circuit (e.g., circuit 561 or 562). The clock recovery circuitry 563 recovers the clock and includes an XOR gate 565 to create the clock signal clock_RX 569. A signal clock_SYS 571 representing the reception of a complete code word is created by counting the clock transitions of a code word using a counter circuit 567.

As shown by FIG. 5B and is consistent with the embodiments illustrated by FIG. 2, the RX can include the clock recovery circuitry 563, data recovery circuitry 566 and application logic 570. The clock recovery circuitry 563 illustrated by FIG. 5B can include the previously described clock recovery circuitry illustrated by FIG. 5A. The data recovery circuitry 566 includes a look-up table 568 and logic circuits (e.g., the illustrated shift registers). More specifically, FIG. 5B illustrates data recovery using a 4c-bit shift register with dual-edge triggered flip-flops for each of the two wires, and a look-up table 568 that at the end of each cycle converts the shift register contents to data bits. As previously described, the data recovery can be dependent on signal transitions (edges that are either rising or falling), not on status of the signals.

Figure 6:
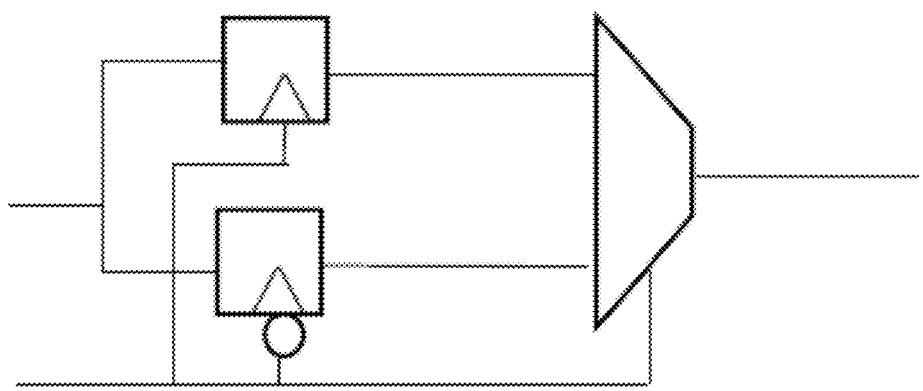
FIG. 6 illustrates an example circuitry of an apparatus, used as flip-flop clocked by both the rising and the falling clock edge, in accordance with the present disclosure.

FIG. 6 illustrates an example circuitry of an apparatus, in accordance with the present disclosure. Both the counter circuitry illustrated by FIG. 5A and the data recovery circuit shown in FIG. 4 (and further in FIG. 8) can include dual-edge triggered flop-flops. FIG. 6 illustrates an example of a dual-edge triggered flip-flop. This allows for a complete timing-less design without use of a delay element, PLL, clock generator, etc.

Figure 7:
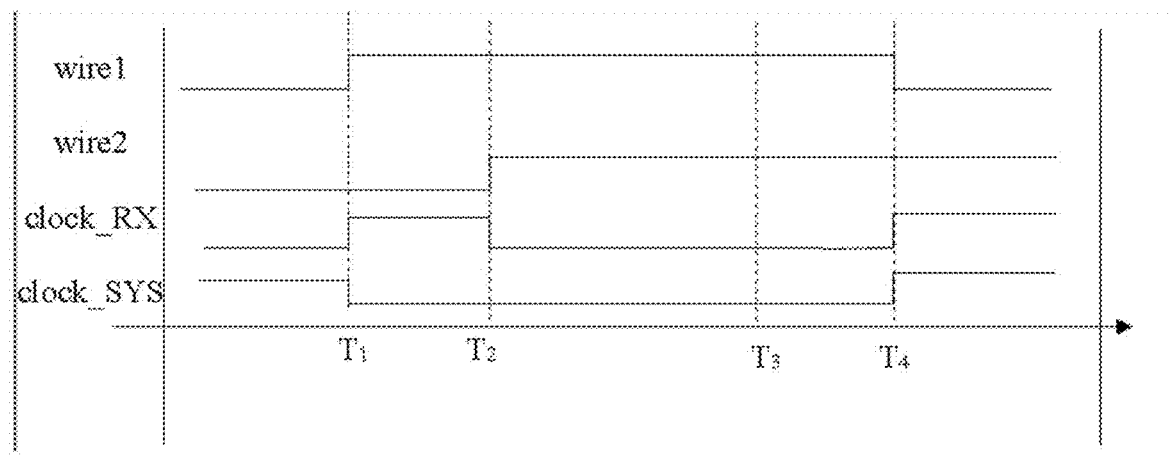
FIG. 7 illustrates an example of a code word timing, in accordance with the present disclosure.

FIG. 7 illustrates an example of a code word timing, in accordance with the present disclosure. The code word timing illustrated by FIG. 7 is consistent with that described previously by FIG. 3A. The timing diagram of FIG. 7 further illustrates the two clock signals recovered by RX circuitry, such as the RX circuitry illustrated by FIGS. 5A-5B.

Figure 8:
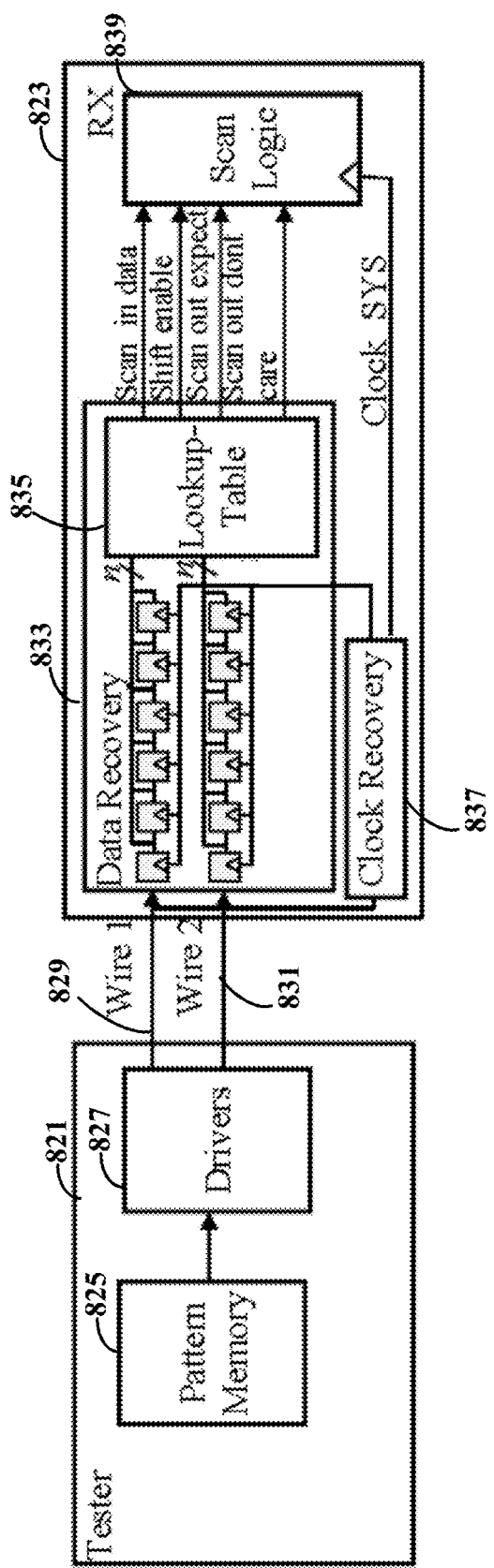
FIG. 8 illustrates an example of an apparatus for communicating data to an integrated circuit for production testing, in accordance with the present disclosure.

FIG. 8 illustrates an example of an apparatus for communicating data to an IC for production testing, in accordance with the present disclosure. The apparatus includes tester circuitry 821 that communicates data to an IC 823 that is under test using the wired-data bus having two wires 829, 831. Various specific embodiments are directed to data transmission from production tester to an IC, such as for a scan test. Due to the edge stealing, the recovered clock on the receiver IC may miss some clock edges. However a scan test with on-chip comparison can be performed. As explained above and in accordance with various embodiments, the coding of one out of six possible code word per cycle is especially suitable for scan test with on-chip comparison.

A coarse overview of the hardware for scan test using a production tester circuitry 821 as a TX is shown in FIG. 8. For simplicity, only plain scan test, without on-chip test data compression (e.g. Mentor Graphic Embedded Deterministic Test) is shown, however embodiments are not so limited.

On the side of the tester circuitry 821, the scan data is assumed to be already processed to the code used, and stored in the pattern memory 825. Hence, no additional hardware at the tester/transmitter side is needed, and the tester circuitry 821 can include the pattern memory 825 and a bus-driver circuit 827 for communicating data over the wired-data bus to the IC 823.

In the receiver IC 823, e.g., the device under test, the data stream is processed as described above. The receiver IC 823 includes the above-described data recovery circuitry 833 that includes a look-up table 835 and logic circuit, a data recovery circuitry 837, and scan logic 839 (e.g., application logic).

The data word output by the look-up table 835 splits into: scan_in data to be shifted into the scan chain, do not care data, to mask out the data shifted out of the scan chains, which are undefined, expected values against which the data shifted out of the scan chains are compared, and which is provided to the scan logic 839. In some specific embodiments, eight drive edges per cycle in the standard ("X1") mode can be used. A cycle can include four drive edges (T1 . . . T4); hence also the dual mode ("X2") is possible where two IC cycles are represented by one tester cycle (using eight drive edges).

The above described and illustrated apparatus can be used to implement a variety of methods. An example method involves communicating data between a first circuit and a second circuit over a wired-data bus. The method includes operating an IC chip in at least one of the first and second circuits, by communicating information through a first data-communication port and a second data-communication port of the IC chip and through respective first and second conductors of the wired-data bus. The method further includes using logic circuitry within and as part of the IC chip to communicate code words of a set of code words over the data bus by using signal transitions communicated on the first and second conductors. As previously described, each of the code words conveys clocked data bits indicated by the signal transitions and information unique relative to other ones of the code words by a known sequential pattern of the signal transitions defined relative to timing associated with the clocked data bits and used to differentiate individual ones of the clocked data bits.

Embodiments in accordance with the present disclosure are directed to coding and corresponding data interfaces that use the order of signal transitions on a two-wire data bus. The data is self-clocking and does not use a PLL or similar for clock recovery at the receiver, hence being completely sequential. The data transmission offers a higher data rate than DDR two-wire busses and does not use a dedicated clock wire, hence having much less spurs in the frequency domain and lower electromagnetic interference. Additionally, various embodiments can include enhancing the protocol with error correction/detection capabilities. If the wired-data bus is used only for scan test, the bus pins can be shared with functional pins. The wired-data bus can be used for programming and reading on-chip instruments, e.g. via an IEEE 1687-compliant interface, both in production test and in the application or for functional safety in the field. Data rates can be varied, e.g., to adapt for receivers of different speed. A portion of the code words may have a special meaning, e.g., the shift-enable bit for scan test. In addition to achieving a data rate which exceeds the data rate of DDR two-wire busses, embodiments can involve avoiding use of external continuously-running clock wire, lowering electromagnetic interference, especially lower spurs, and lowering energy consumption. Additionally, embodiments are DC free, the given protocol is already DC-free by design, unlike protocols like Ethernet that use coding to avoid an unlimited series of 0 or of 1, which may not be transferrable via channels with a lower frequency limit.

Terms to exemplify orientation, such as upper/lower, left/right, top/bottom and above/below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

The skilled artisan would recognize that various terminology as used in the Specification (including claims) connote a plain meaning in the art unless otherwise indicated. As examples, the Specification describes and/or illustrates aspects useful for implementing the claimed disclosure by way of various circuits or circuitry which may be illustrated as or using terms such as blocks, modules, device, system, unit, controller, application logic, and/or other circuit-type depictions (e.g., reference numerals 104, 108 of FIG. 1 depict a block/module as described herein). Such circuits or circuitry are used together with other elements to exemplify how certain embodiments may be carried out in the form or structures, steps, functions, operations, activities, etc. For example, in certain of the above-discussed embodiments, one or more modules are discrete logic circuits or programmable logic circuits configured and arranged for implementing these operations/activities, as may be carried out in the approaches shown in FIGS. 2, 4, and 5A-5B. In certain embodiments, such a programmable circuit is one or more computer circuits, including memory circuitry for storing and accessing a program to be executed as a set (or sets) of instructions (and/or to be used as configuration data to define how the programmable circuit is to perform), and an algorithm or process as described above is used by the programmable circuit to perform the related steps, functions, operations, activities, etc. Depending on the application, the instructions (and/or configuration data) can be configured for implementation in logic circuitry, with the instructions (whether characterized in the form of object code, firmware or software) stored in and accessible from a memory (circuit).

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. For instance, a RX apparatus can include the circuitry illustrated by FIGS. 5A and 5B. As another example, an apparatus can include the TX apparatus illustrated by FIG. 4 and an RX apparatus having the circuitry illustrated by FIGS. 5A and 5B. Such modifications do not depart from the true spirit and scope of various aspects of the disclosure, including aspects set forth in the claims.

What is claimed is:

1. An apparatus for communicating data between a first circuit and a second circuit over a wired-data bus, the apparatus comprising:
   an integrated circuit chip within at least one of the first and second circuits, the integrated circuit chip having a first data-communication port and a second data-communication port configured and arranged for connection to respective first and second conductors of the wired-data bus; and
   a logic circuit configured and arranged within and as part of the integrated circuit chip, the logic circuit communicatively coupled to the first and second data-communication ports, and configured and arranged to communicate a code multi-bit word out of a set of code multi-bit words over the wired-data bus by using signal transitions communicated on the first and second conductors, with the code multi-bit word conveys:
   clocked data bits indicated by the signal transitions, and information unique relative to other ones of the set of code multi-bit words by a known sequential pattern of the signal transitions defined relative to timing associated with the clocked data bits and used to differentiate individual ones of the clocked data bits independent of timing of the signal transitions and a state of the signal transitions.

2. The apparatus of claim 1, wherein the wired-data bus is a two-wire data bus including the first and second conductors, the apparatus further including a bus-driver circuit and a clock timing circuit configured to generate a clock drive signal for sending data bits over the wired-data bus at a data rate between 10 MHz and 50 MHz for a channel capacity of the wired-data bus that is at least 2.5 bits per cycle using the first and second conductors and not greater than 2.75 bits per cycle, the bus-driver circuit arranged as part of the integrated circuit chip and configured to send the code multi-bit word as clocked data bits over the wired-data bus according to timing defined by the clock timing circuit.

3. The apparatus of claim 1, further including a bus-receiver circuit, wherein the integrated circuit chip is configured and arranged to receive the code multi-bit word over the wired-data bus via the bus-receiver circuit, and to discern each of the clocked data bits by detecting the signal transitions, wherein the code multi-bit word and the known sequential pattern of the signal transitions are defined to achieve overall channel skewing of the signal transitions relative to the first and second conductors of the wired-data bus, by up to twenty percent of a time span corresponding to two consecutive junctures respectively corresponding to permissible times for the signal transitions.

4. The apparatus of claim 1, further including a look-up data circuit in at least one of the first circuit and the second circuit including information that associates each of the known sequential patterns of the signal transitions with one of the set of code multi-bit words, wherein known sequential patterns of the signal transitions include an order of signal transitions communicated on the first conductor and an order of signal transitions communicated on the second conductor, and the code multi-bit word is communicated independent of the timing of the signal transitions and the state of the signal at each signal transition, the state include a rising or failing signal edge.

5. The apparatus of claim 1, wherein for at least one of the set of code multi-bit words, one or more known sequential patterns of the signal transitions include individual ones of the clocked data bits without a signal transition in one of the conductors.

6. The apparatus of claim 1, wherein for the code multi-bit word, the known sequential pattern of the signal transitions starts without a signal transition in one of the conductors and while a signal state associated with the first conductor corresponds to first binary logic state, and wherein for another code multi-bit word, another known sequential pattern of the signal transitions starts without a signal transition and while the signal state associated with the first conductor corresponds to second binary logic state.

7. The apparatus of claim 1, wherein the code multi-bit word is represented by the signal transitions and independent of the signal transitions being rising or failing, as opposed to signal states between edges of signals carried by the first and second conductors of the wired-data bus.

8. The apparatus of claim 1, wherein the code multi-bit word is conveyed over the wired-data bus in one cycle of a discrete number of times, each of the times associated with a juncture at which a permissible one of the signal transitions occur.

9. The apparatus of claim 1, wherein the code multi-bit word is conveyed over the wired-data bus in one cycle of a discrete number of times, each of the times associated with a juncture at which a permissible one of the signal transitions occur, and wherein the times associated with junctures at which permissible ones of the signal transitions occur exclude junctures corresponding to a start of the code multi-bit word and at an end of the code multi-bit word.

10. The apparatus of claim 1, wherein each of the set of code multi-bit words is conveyed over the wired-data bus in one cycle of a discrete number of times, each of the times is associated with junctures at which a permissible one of the signal transitions can occur, and wherein the times associated with the junctures at which permissible ones of the signal transitions occur exclude a juncture corresponding to a signal transition on the first conductor of the wired-data bus aligning with a juncture corresponding to a signal transition on the second conductor of the wired-data bus.

11. The apparatus of claim 1, wherein the logic circuit is further configured to communicate the code multi-bit word over the wired-data bus according to a protocol that defines one cycle of bits for each code multi-bit word, with each code multi-bit word represented by three edges in the cycle, with no more than six possible code multi-bit words, and with one cycle encoding one multi-bit word including a plurality of discrete times at which signal transitions occur.

12. The apparatus of claim 1, wherein the logic circuit is further configured to communicate at least the code multi-bit word over the wired-data bus according to a protocol that defines one cycle of bits for each code multi-bit word as a plurality of discrete times at which signal transitions occur, with each code multi-bit word of the set of code multi-bit words represented by three edges in the cycle, and with exactly six possible code multi-bit words, and further including a code-word detection circuit within the integrated circuit chip configured to compare bits received over the wired-data bus with the known sequential patterns.

13. The apparatus of claim 1, wherein the logic circuit is further configured to communicate at least the code multi-bit word over the wired-data bus according to a protocol that defines a plurality of cycles of bits for each code multi-bit word in the set, with each code multi-bit word of the set of code multi-bit words represented by a same number of edges in each cycle, and with more than six possible code multi-bit words in the set.

14. The apparatus of claim 1, wherein the logic circuit is further configured to communicate at least the code multi-bit word over the wired-data bus according to a protocol that defines each code multi-bit word as being represented by a same number of edges in each cycle.

15. The apparatus of claim 1, wherein the logic circuit is further configured to communicate at least the code multi-bit word over the wired-data bus according to a protocol that defines the code multi-bit word as represented by a number of code bits being greater than 3 and not greater than 8, and being conveyed over a number of cycles of discrete times at which the signal transitions occur that is at least 2 and not greater than 3.

16. The apparatus of claim 1, further including a bus-driver circuit and a clock-timing circuit configured to generate a clock drive signal, for sending data bits over the wired-data bus, with a signal-transition clock rate that is continuous.

17. The apparatus of claim 1, wherein each of the first and second circuits are an integrated circuit, a printed circuit board (PCB) with discrete and/or integrated circuits mounted, or a circuit forming part of an integrated circuit.

18. An apparatus for use in communicating data between a first circuit and a second circuit over a two-wire data bus, the apparatus comprising:
  an integrated circuit chip having a first data-communication port and a second data-communication port, and a bus-receiver circuit configured and arranged for connection to respective first and second conductors of the two-wire data bus; and
  a logic circuit configured and arranged within and as part of the integrated circuit chip, the logic circuit communicatively coupled to the first and second data-communication ports of the two-wire data bus, and configured and arranged to receive code multi-bit words out of a set of code multi-bit words over the two-wire data bus by detecting signal transitions communicated on the first and second conductors, with each of the code multi-bit words conveying clocked data bits indicated by the signal transitions, and information unique relative to other ones of the set of code multi-bit words by a set of known sequential patterns of the signal transitions defined relative to timing associated with the clocked data bits and used to differentiate individual ones of the clocked data bits; and a code-word detection circuit configured and arranged to detect received ones of the code multi-bit words by recovering the timing associated with the clocked data bits, and based on the recovered timing, validating the received ones of the code multi-bit words by comparison to the set of known sequential patterns of the signal transitions and independent of timing of the signal transitions and a state of the signal transitions.

19. The apparatus of claim 18, further including the two-wire data bus;

the first circuit including the integrated circuit chip;

the second circuit including a bus-driver circuit, the bus-driver circuit coupled to the two-wire data bus;

a clock timing circuit cooperatively arranged with the bus-driver circuit to send the code multi-bit words as clocked data bits over the two-wire data bus for differentiating individual ones of the clocked data bits; and the code-word detection circuit is configured and arranged to recover the timing associated with the clocked data bits based on a count of a number of the signal transitions over the two-wire data bus.

20. A method involving communication of data between a first circuit and a second circuit over a wired-data bus, the method comprising:

operating an integrated circuit chip in at least one of the first and second circuits, by communicating information through a first data-communication port and a second data-communication port of the integrated circuit chip and through respective first and second conductors of the wired-data bus; and using logic circuitry within and as part of the integrated circuit chip to communicate code multi-bit words of a set of code multi-bit words over the wired-data bus by using signal transitions communicated on the first and second conductors, with each of the code multi-bit words conveying:

clocked data bits indicated by the signal transitions, and information unique relative to other ones of the code multi-bit words by a known sequential pattern of the signal transitions defined relative to timing associated with the clocked data bits and used to differentiate individual ones of the clocked data bits independent of timing of the signal transitions and a state of the signal transitions.

* * * * *